United States Patent
Ye et al.

(10) Patent No.: US 7,996,193 B2
(45) Date of Patent: Aug. 9, 2011

(54) METHOD FOR REDUCING MODEL ORDER EXPLOITING SPARSITY IN ELECTRONIC DESIGN AUTOMATION AND ANALYSIS

(75) Inventors: Zuochang Ye, Albany, CA (US); Zhenhai Zhu, Alameda, CA (US); Joel Phillips, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 542 days.

(21) Appl. No.: 12/106,948

(22) Filed: Apr. 21, 2008

(65) Prior Publication Data

US 2009/0265150 A1    Oct. 22, 2009

(51) Int. Cl.
    *G06F 7/60*   (2006.01)
(52) U.S. Cl. .......................................................... 703/2
(58) Field of Classification Search ...................... 703/2
    See application file for complete search history.

(56) References Cited

U.S. PATENT DOCUMENTS

| | | | |
|---|---|---|---|
| 6,349,272 | B1* | 2/2002 | Phillips ............................ 703/2 |
| 2005/0160382 | A1* | 7/2005 | Wang ............................... 703/2 |
| 2006/0080068 | A1* | 4/2006 | Feldmann et al. ............... 703/2 |
| 2007/0226659 | A1* | 9/2007 | Suaya et al. ..................... 703/1 |
| 2008/0052651 | A1* | 2/2008 | Wang ............................. 703/19 |

OTHER PUBLICATIONS

Bastian et al. 2003., Proceedings $4^{th}$ MathMod Vienna., "Order Reduction For Second Order Systems". pp. 418-424.*

* cited by examiner

*Primary Examiner* — Paul L Rodriguez
*Assistant Examiner* — Eunhee Kim
(74) *Attorney, Agent, or Firm* — Dickstein Shapiro LLP

(57) ABSTRACT

A method for reducing the order of system models exploiting sparsity is disclosed. According to one embodiment, a computer-implemented method receives a system model having a first system order. The system model contains a plurality of system nodes, a plurality of system matrices. The system nodes are reordered and a reduced order system is constructed by a matrix decomposition (e.g., Cholesky or LU decomposition) on an expansion frequency without calculating a projection matrix. The reduced order system model has a lower system order than the original system model.

20 Claims, 3 Drawing Sheets

METHOD FOR REDUCING MODEL ORDER EXPLOITING SPARSITY IN ELECTRONIC DESIGN AUTOMATION AND ANALYSIS

FIELD

The field of the invention relates generally to hardware and software verification of logic circuits and more particularly relates to a method for reducing system models in electronic design automation and analysis.

BACKGROUND

Model order reduction (MOR) is a technique used to reduce the order of system models under analysis by simplifying overly complex aspects of the system. The reduced order system model is a good approximation that possesses the key properties and maintains fidelity to the original system model. In order to create good representative models for analysis, algorithms used for reducing model order must be efficient and accurate. Model order reduction typically demands a good understanding of inputs and outputs to the system, the purpose of analysis, the level of fidelity required for the analysis and the efficiency of the analysis obtained by the model order reduction.

In the realm of electronic design automation (EDA), current MOR methods work well on system models having a small number of externally connected terminals, commonly termed "ports". As more ports are added to a system model, the size of the network also increases. As more internal nodes are added to the system model, the size of the network gets even bigger. Due to the complexity of the system model, current model order reduction methods cannot handle the size of the network exceeding ten million nodes. Two major approaches have been taken to resolve the issues associated with the network size: projection-based methods and elimination-based methods.

Projection-based methods are suitable for system models with a small number of ports. Since both the CPU and memory requirements scale quadratically to the number of ports, projection-based methods are not well suited for system models with many ports. In addition, in most cases, projection methods for model order reduction are of similar complexity, meaning that the reduced system matrices might be still too dense to benefit from computational advantages. The order of the reduced model is at least equal to and generally larger than the number of ports.

Elimination-based methods eliminate a number of nodes that have little or no interest during simulation. As an example, an RC network is reduced by eliminating internal nodes via steps of approximation and simplification. Elimination-based methods reduce the order of the system by elimination of the internal nodes but still have difficulties with a large number of nodes with large time constants, for example, power grid networks with device capacitors. Elimination-based methods may result in over simplification or incorrect representation of the original system model.

SUMMARY

A method for reducing the order of system models exploiting sparsity is disclosed. According to one embodiment, a computer-implemented method receives a system model having a first system order. The system model can be an integrated circuit design having a plurality of system nodes and a plurality of system matrices. The system nodes are reordered and a reduced order system is constructed by a matrix decomposition (e.g., Cholesky or LU decomposition) on an expansion frequency without calculating a projection matrix. The reduced order system model has a lower system order than the original system model.

The above and other preferred features, including various novel details of implementation and combination of elements, will now be more particularly described with reference to the accompanying drawings and pointed out in the claims. It will be understood that the particular methods and circuits described herein are shown by way of illustration only and not as limitations. As will be understood by those skilled in the art, the principles and features described herein may be employed in various and numerous embodiments without departing from the scope of the invention.

BRIEF DESCRIPTION OF THE DRAWINGS

The accompanying drawings, which are included as part of the present specification, illustrate the presently preferred embodiments and together with the general description given above and the detailed description of the preferred embodiment given below serve to explain and teach the principles of the present invention.

Figure 1:
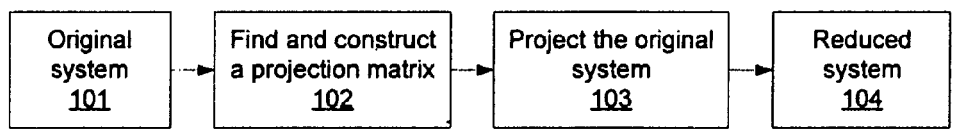
FIG. 1 illustrates an exemplary process of a prior art projection-based MOR method, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method for reducing the order of system models exploiting sparsity is disclosed. The disclosed method for reducing the order of system models constructs a projection matrix implicitly without calculating it from system matrices. The disclosed method for reducing the order of system models produces accurate reduced order models with a large number of nodes efficiently, thus saving the cost for system analysis.

Each of the features and teachings disclosed herein can be utilized separately or in conjunction with other features and teachings to provide a method for reducing the order of system models exploiting sparsity. Representative examples utilizing many of these additional features and teachings, both separately and in combination, are described in further detail with reference to the attached drawings. This detailed description is merely intended to teach a person having ordinary skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required in order to practice the various inventive concepts disclosed herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Various apparatus can be used with the various embodiments described herein. One apparatus may be specially constructed for the required purposes, while another may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Analysis of large scale systems often involves model order reduction (MOR) to achieve faster analysis at a reduced cost. A complex system model is approximated to a reduced model by eliminating variables of no or less importance while also preserving the input/output behavior of the original system and physical properties of the original model. FIG. 1 illustrates an exemplary process of a prior art projection-based MOR method. The projection-based MOR method receives an original system expressed in terms of system matrices (101) and constructs a projection matrix (102). The projection matrix projects the system matrices to a subspace of lesser dimension for computational efficiency. By projecting the system matrices using the projection matrix (103), a reduced system is constructed (104).

The cost of projection-based MOR methods quadratically grows with the number of ports of the system. After selecting a projection matrix M, the projected system matrix $\hat{G}$ is calculated by the following equation:

$$\hat{G} = M^T G M. \quad (1)$$

The projection matrix M projects the input vector into a subspace of a reduced order.

Figure 2:
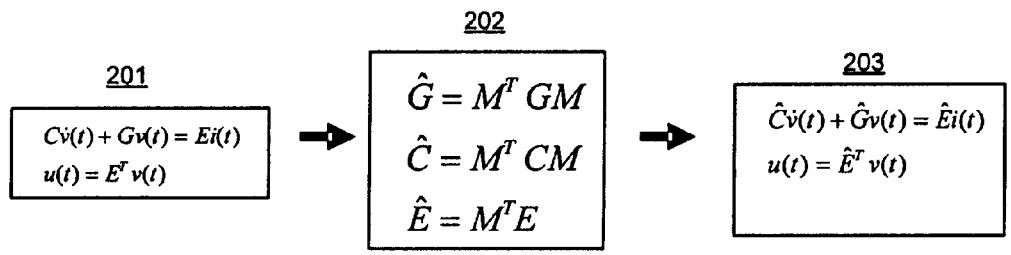
FIG. 2 illustrates an exemplary MOR process of an RC network model, according to one embodiment.

FIG. 2 illustrates an exemplary MOR process of an RC network model, according to one embodiment. Original system model 201 includes an input vector i(t) (e.g., input currents at the ports), output vector u(t) (e.g. output voltage on the ports), conductance matrix G, capacitance matrix C and topological matrix E that maps the ports to the nodes. System matrices G, C, and E are projected using a projection matrix M by congruence transformation (202) and projected system matrices $\hat{G}$, $\hat{C}$, and $\hat{E}$ are constructed. The reduced-order system model 203 is expressed in terms of the projected system matrices. Typically, the projection matrix M is selected to render the projected system matrices better conditioned than original system matrices and the reduced-order system is solved with efficiency. According to one embodiment, projection matrix M comprises columns spanning a useful subspace such as a Krylov subspace. Krylov subspaces match the moments of the system well at a certain frequency or a range of frequencies. According to another embodiment, projection matrix M projects the original system matrices for the purpose of easier matrix manipulation without reducing the order of the system. Different projection matrices yielding different properties of the reduced system may be applied without deviating from the scope of the present subject matter.

Projection-based MOR methods reduce the order of the original system. For example, if projection matrix M is an n-by-m matrix, where n being bigger than m. The matrix projection as shown in 202 converts matrix G and C of dimension n-by-n to matrix $\hat{G}$, $\hat{C}$ of dimension m-by-m, thus the order of the system model is reduced by n−m. For example, n is the total number of nodes and m is the number of port nodes.

According to one embodiment, the present MOR method performs the projection implicitly by using a sparse projection matrix, or an operation equivalent to the projection that leads to the reduction of the system order. The projection matrix M does not need to be constructed explicitly. As a result, the matrix operations of 202 need not to be performed. The reduced system matrices $\hat{G}$, $\hat{C}$, and $\hat{E}$ are computed implicitly during the matrix decomposition, for example a Cholesky or LU decomposition. This allows the cost of matrix operation to be reduced.

In order to provide the mathematical foundation for a MOR method by sparse implicit projection (SIP), an example of a single-point frequency matching is considered. The concept of single-point SIP can be extended to multi-point cases to further refine the reduced-order system model for enhanced accuracy at little or no additional cost. Suppose that the system matrices G, C, and E of original system 201 are sparse and G and C are symmetric. Node vector v(t) is reordered to separate the port nodes from the internal nodes such that the mapping matrix E is rewritten as $$E = \begin{bmatrix} 0 \\ I \end{bmatrix}. \quad (2)$$

Using a sparse matrix factorization, matrix G is factorized as $$G = \begin{bmatrix} A & B \\ B^T & D \end{bmatrix}, \quad (3)$$

where A is an l-by-l matrix, B is an l-by-m matrix and D is an m-by-m matrix. The total number of nodes n is the summation of the number of port nodes m and the number of internal node l, i.e., l=n−m. According to one embodiment, the single point is selected such that the projection matrix matches moments at DC voltage. In this case, the capacitive term C v(t) is assumed to be negligible and the input current i(t) is time-invariant. Then the first equation of 201 is rewritten as $$GV = \begin{bmatrix} A & B \\ B^T & D \end{bmatrix} \begin{bmatrix} V_1 \\ V_2 \end{bmatrix} = E = \begin{bmatrix} 0 \\ I \end{bmatrix}, \quad (4)$$

where node vector V is factorized with $V_1$ and $V_2$ denoting the voltages on internal nodes and the voltages on port nodes respectively. Applying block-wise Gauss elimination, the matrix Eq. 4 leads to the following reduced order equation, $$SV_2 = (D - B^T A^{-1} B) V_2 = I. \quad (5)$$

Matrix S is known as the Schur complement and solving Eq. 5 for $V_2$ leads to the solution of the reduced order system. Projection matrix M is defined as $$M = \begin{bmatrix} -A^{-1} B \\ I \end{bmatrix} \quad (6)$$

and the solution for the node vector V is calculated by $$V = \begin{bmatrix} V_1 \\ V_2 \end{bmatrix} = MS^{-1}. \quad (7)$$

The calculation of the Schur complement S by Eq. 5 is computationally intensive particularly when the original system 201 has a large number of port nodes. In addition, the projection matrix M is required to be explicitly constructed as shown in Eq. 6.

According to one embodiment, the Schur complement S is obtained much more efficiently by a Cholesky decomposition. If conductance matrix G is factorized by a Cholesky decomposition as $$G = \begin{bmatrix} A & B \\ B^T & D \end{bmatrix} = \begin{bmatrix} L_1 \\ L_3 & L_2 \end{bmatrix} \begin{bmatrix} L_1^T & L_3^T \\ & L_2^T \end{bmatrix}, \quad (8)$$

then the Schur complement S is easily calculated by $$S = L_2 L_2^T. \quad (9)$$

It is known that the Schur can be rewritten as a congruence transformation as $$S = M^T G M, \quad (10)$$

where the projection matrix M is defined by Eq. 6. In view of Eq. 1, the Schur complement S of Eq. 10 is the projected matrix $\hat{G}$ and is directly obtainable from the $L_2$ matrix of the Cholesky decomposition without calculating the projection matrix M.

According to one embodiment, the projected matrix $\hat{G}$ is implicitly performed by a Cholesky decomposition without projecting them with a projection matrix M. In this case, passivity of the original system model is preserved since such a projection is a congruence transformation. In a similar fashion, the other system matrices C and E are also projected without explicitly projecting them using the projection matrix M.

Figure 3:
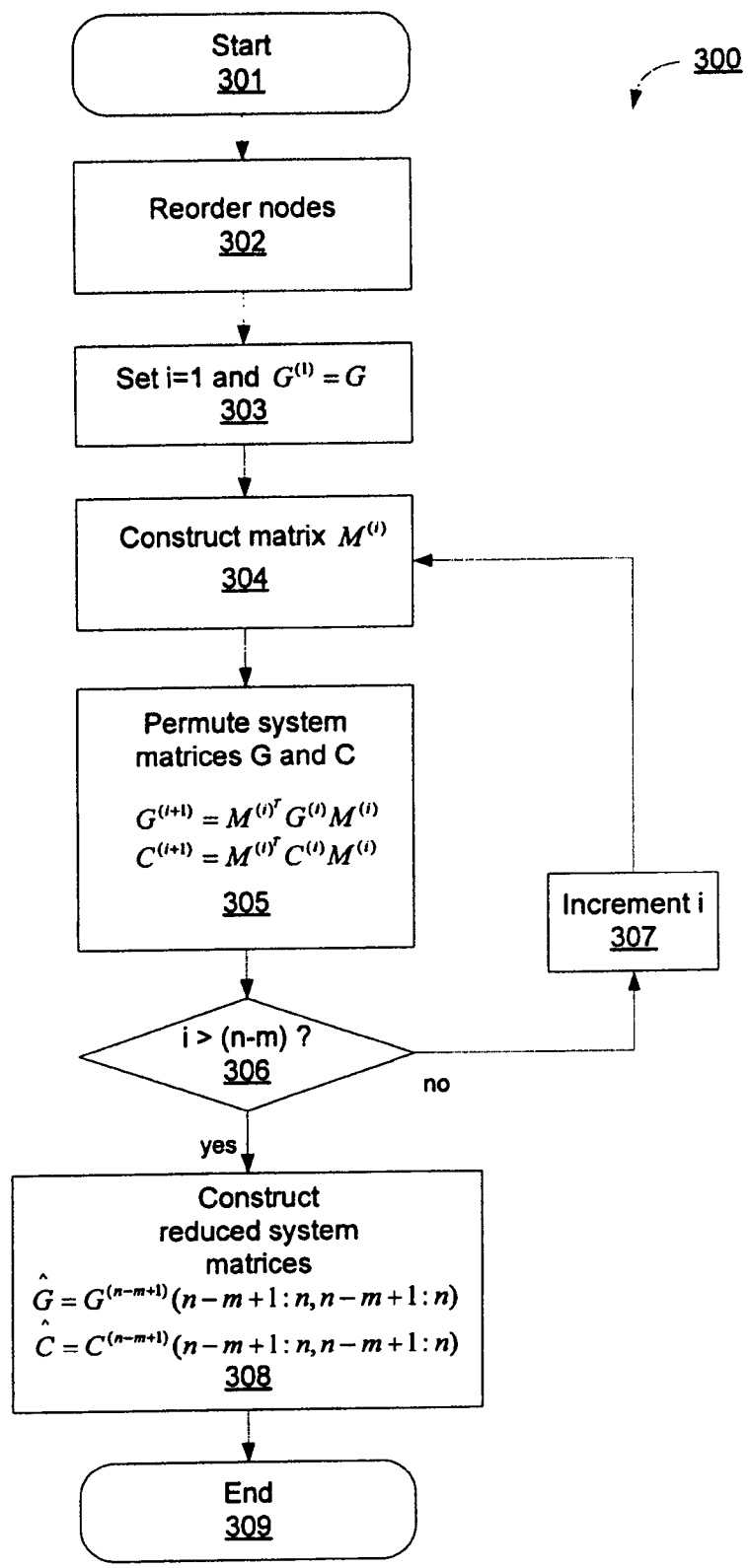
FIG. 3 illustrates an exemplary process of a single-point MOR method by sparse implicit projection, according to one embodiment.

FIG. 3 illustrates an exemplary process of a single-point MOR method by sparse implicit projection, according to one embodiment. The original system is rearranged to reduce the fill-ins of the system matrices. Fill-ins are the non-zero entries of a matrix introduced by sparse matrix factorization. The number of fill-ins in a matrix corresponds to the cost of matrix factorization, thus various reordering schemes are used to reduce the number of fill-ins. According to one embodiment, the port nodes are moved to the bottom of the node vector such that the mapping matrix E is expressed as shown in Eq. 2 (302). According to another embodiment, the nodes that are to be reduced are moved to the top of the node vector to facilitate Gaussian elimination. It is noted that the rearrangement or reordering of the node variables may be done in different ways to achieve different goals without deviating the scope of the present subject matter.

According to one embodiment, Cholesky decomposition is performed recursively to the system model to reduce the order of the system model. In each ith recursive step, a sparse projection matrix $M^{(i)}$ is constructed (304) by Cholesky decomposition and the (i+1)th system matrices are projected with the sparse projection matrix $M^{(i)}$. This implicit sparse projection eliminates a node variable, thus reduces the order of the system by one. To begin the recursive projection process, $G^{(1)}$ is set to the original matrix G (303) and $C^{(1)}$ is set to the original C matrix. In the (i+1)th step, the system matrices $G^{(i+1)}$ and $C^{(i+1)}$ are updated using the projection matrix $M^{(i)}$, $G^{(i)}$ and $C^{(i)}$ (305). This process is repeated until all the internal nodes are eliminated to construct the reduced matrices $\hat{G}$ and $\hat{C}$ (308).

According to one embodiment, the matrix $G^{(i)}$ is expressed in the following form, $$G^{(i)} = \begin{bmatrix} I_{i-1} & & \\ & a_{i,i} & b_i \\ & b_i^T & B^{(i)} \end{bmatrix}, \quad (11)$$

where $I_{i-1}$ denotes the identity matrix of dimension i-1. Matrix $L^{(i)}$ is defined in terms of $a_{i,j}$ and $b_i$ as $$L^{(i)} = \begin{bmatrix} I & & \\ & \sqrt{a_{i,i}} & \\ & -\frac{1}{a_{i,i}} b_i & I_{n-i} \end{bmatrix}. \quad (12)$$

Matrix $L^{(i)}$ is used to construct the ith sparse projection matrix $M^{(i)}$ by $$M^{(i)} = (L^{(i)})^{-T}. \quad (13)$$

As is illustrated by the matrix Eqs. 11-13, the projection matrix M is not constructed explicitly as conventional projection-based MOR methods (Eqs. 4-6), rather is constructed recursively by exploiting sparsity of $M^{(i)}$ matrices.

The single-point SIP method 300 performs Cholesky decomposition in a series of congruence transformations. Every congruence transformation eliminates a single internal node (305). Congruence transformations are performed recursively only l times (l=n−m), instead of performing for the decomposition n times for the entire nodes.

The single-point SIP method 300 based on first-order approximations does not always produce sufficiently accurate results as one desires. According to one embodiment, the single-point SIP method 300 is extended to construct a reduced-order model by a multi-point approximation to enhance accuracy. Multiple projection matrices are obtained from multiple frequencies, i.e., expansion frequencies, selected within the frequency range of interest. For a given model order, multi-point approximations are at least as accurate as a single-point approximation and sometimes are more efficient since they better distribute the model errors over a wider frequency range of interest.

According to one embodiment, multi-point moment matching method 400 repeats the single-point SIP on q expansion points with frequencies $s_1, s_2 \ldots s_q$ by shifting moments. The shifted system is expressed with matrices $G_i, C$ and E, where $G_i=G+s_iC$. Similar reordering and factorizing techniques are applied to reduce the model at ith frequency and after repeating over the q frequencies, reduced matrices $\hat{G}_i, \hat{C}$ and $\hat{E}$ are obtained.

Figure 4:
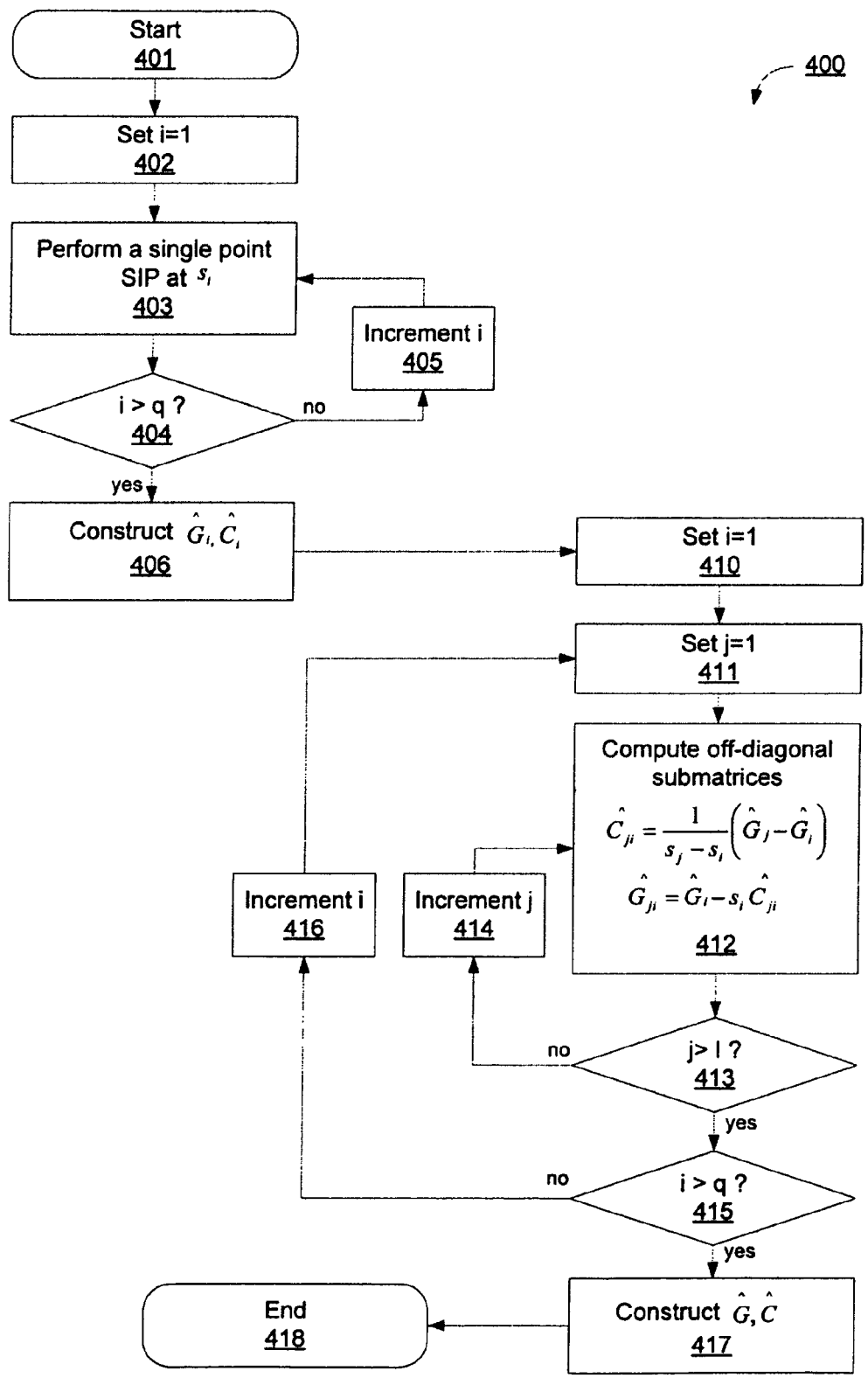
FIG. 4 illustrates an exemplary process for multi-point MOR method by sparse implicit projection, according to one embodiment.

FIG. 4 illustrates an exemplary process for multi-point MOR method by sparse implicit projection, according to one embodiment. A single point SIP is performed at a frequency $s_j$ (403) and is repeated q times by changing the frequency to construct reduced matrices $\hat{G}_i$ and $\hat{C}_i$ (i=1 to q) (406). The reduced matrices $\hat{G}_i$ and $\hat{C}_i$ fill the reduced system matrices $\hat{G}$ and $\hat{C}$ diagonally as shown in Eqs. 14 and 15 (note that $\hat{G}_i=M_i^TGM_i$ and $\hat{C}_i=M_i^TCM_i$). Off-diagonal submatrices $M_j^TGM_i$ and $M_j^TCM_i$ (where j≠i) are recursively obtained by equations at 412 using the diagonal submatrices until the entire reduced matrices $\hat{G}$ and $\hat{C}$ are constructed (417). The reduced matrices $\hat{G}$ and $\hat{C}$ are constructed with the $q^2$ submatrices as follows.

$$\hat{G} = M^TGM = \begin{bmatrix} M_1^TGM_1 & \ldots & M_1^TGM_q \\ \vdots & \ddots & \vdots \\ M_q^TGM_1 & \ldots & M_q^TGM_q \end{bmatrix}, \quad (14)$$

$$\hat{C} = M^TCM = \begin{bmatrix} M_1^TCM_1 & \ldots & M_1^TCM_q \\ \vdots & \ddots & \vdots \\ M_q^TCM_1 & \ldots & M_q^TCM_q \end{bmatrix}. \quad (15)$$

According to one embodiment, the present MOR method by sparse implicit projection runs simulation much faster and consumes much less memory than conventional projection-based MOR methods. The CPU time and memory requirements does not scale with the number of ports whereas, for projection-based MOR methods, the CPU time increases quadratically and the memory scales linearly with the number of ports. For these reasons, the present MOR method possesses greater advantages particularly with systems with a large number of ports.

The accuracy and computational efficiency of the reduced-order system is determined by the choice of a projection matrix. A common choice for a projection matrix is the zeroth order projection matrix matching moments around the DC voltage input (s=0). According to another embodiment, q moments (q is bigger than 1) are matched for non-symmetric cases to construct a reduced order model of order q. As a special case of a non-symmetric case, 2q moments can be matched for a symmetric case. The proof for the non-symmetric case is beyond the scope of the present subject matter, therefore it will not be described herein.

For conventional projection-based MOR methods, the reduced-order system model might be dense or sparse depending on the system topology and partitioning. Therefore, selecting a projection matrix is emphasized for computational efficiency and ultimately the accuracy of the reduced system model. In contrast, the present MOR method implicitly constructs a reduced system model in the process of matrix decomposition. Since the present MOR method exploits sparsity of the projection matrix, the reduced system may be obtained without completing the matrix decomposition for the entire nodes. According to one embodiment, a sparse matrix factorization tool automates the decomposing process of system matrices. For example, CHOLMOD or UMFpack both by Timothy A. Davis, University of Florida, are used for matrix factorization.

Unlike conventional projection-based methods, the present MOR method preserves spatial and geometric structure in the reduced model, so further reduction of model is possible. Further reduction may be done by various methods. For example, the off-diagonal terms that are small compared to the corresponding diagonal term is dropped. The reduced model by the present MOR method is better posed for further reduction compared to other conventional MOR methods.

According to one embodiment, the present MOR method is extended to cases where matrices G and C are asymmetric. For asymmetric cases, for example an RLC network, Cholesky decomposition is replaced with LU decomposition and the relationship between the Schur complement and the decomposition still holds. For example, if matrix G is partitioned as $$G = \begin{bmatrix} A & B \\ C^T & D \end{bmatrix}, \quad (16)$$

then, the Schur complement is expressed in terms of the partitioned matrices as $$S = D - C^T A^{-1} B. \quad (17)$$

On the other hand, if Matrix G is decomposed by LU decomposition, i.e., $$G = LU = \begin{bmatrix} L_1 & \\ L_3 & L_2 \end{bmatrix} \begin{bmatrix} U_1 & U_3 \\ & U_2 \end{bmatrix} \quad (18)$$

then the Schur complement is expressed as $$S = L_2 U_2 \quad (19)$$

Therefore, for asymmetric cases, the projection matrix is constructed implicitly without calculating from system matrices. This means that the relationship between the Schur complement and LU decomposition still holds for asymmetric systems, so does the equivalence between the Schur complement and the congruence transformation. The moment matching property also hold for asymmetric cases as well. Since these two key relationships are valid, the single point SIP method 300 is extended to asymmetric problems by replacing Cholesky decomposition with LU decomposition. Hence, the cost of the single point asymmetric SIP reduction is similar to that of the symmetric SIP reduction.

A method for reducing the order of system models exploiting sparsity is disclosed. Although various embodiments have been described with respect to specific examples and subsystems, it will be apparent to those of ordinary skill in the art that the concepts disclosed herein are not limited to these specific examples or subsystems but extends to other embodiments as well. For example, the present MOR method can be applied to solve an acoustic system whose system model is expressed with a Helmholtz equation. The formulation of a linear system is similar to an RC network described herein. The present MOR method may be applied to different linear systems, whether symmetric or asymmetric, without deviating from the scope of the present subject matter. Included within the scope of these concepts are all of these other embodiments as specified in the claims that follow.

We claim:

1. A computer-implemented method, comprising:
   receiving a system model of a circuit design having a first system order, wherein the system model contains a plurality of system nodes and a plurality of system matrices;
   determining an expansion frequency of the system model;
   factorizing the plurality of system matrices at the expansion frequency by a matrix decomposition, wherein each of the plurality of system matrices is decomposed into a plurality of submatrices including an identity matrix;
   constructing a decomposition matrix ($L^{(i)}$) from the plurality of submatrices;
   constructing a sparse implicit projection matrix ($M^{(i)}$) from the decomposition matrix;
   constructing a plurality of reduced order system matrices from the sparse implicit projection matrix without explicitly calculating a projection matrix (M) directly from the plurality of system matrices;
   constructing a reduced order system model of the circuit design having a second system order with the plurality of reduced order system matrices, wherein the second system order is lower than the first system order; and
   running simulation of the circuit design using the reduced order system model.

2. The computer-implemented method of claim 1, wherein the plurality of system matrices comprise a conductance matrix, a capacitance matrix and a mapping matrix.

3. The computer-implemented method of claim 1, wherein the matrix decomposition is a Cholesky decomposition or an LU decomposition.

4. The computer-implemented method of claim 1, wherein the plurality of system nodes comprises a plurality of internal nodes and a plurality of port nodes.

5. The computer-implemented method of claim 4 further comprises:
   constructing a sparse implicit projection matrix for each of the plurality of internal nodes;
   eliminating an internal node of the plurality of internal nodes in each step of constructing a sparse implicit projection matrix; and
   repeating the step of eliminating an internal node for the plurality of internal nodes.

6. The computer-implemented method of claim 4 further comprises:
   grouping the plurality of internal nodes in a first group and grouping the plurality of port nodes in a second group; and
   reordering the plurality of system nodes by the first and second group.

7. The computer-implemented method of claim 1, wherein the expansion frequency is selected from a set of expansion frequencies.

8. The computer-implemented method of claim 7, wherein the factorizing the plurality of system matrices is repeated over the set of expansion frequencies.

9. The computer-implemented method of claim 5, wherein the second system order is reduced from the first system order by the number of internal nodes after the plurality of internal nodes are eliminated.

10. The computer-implemented method of claim 1, wherein the plurality of submatrices are recursively constructed and the reduced order system model is constructed from the plurality of submatrices.

11. A non-transitory computer-readable storage medium having stored thereon a plurality of instructions, the plurality of instructions when executed by a computer, cause the computer to perform:
   receiving a system model of a circuit design having a first system order, wherein the system model contains a plurality of system nodes and a plurality of system matrices;
   determining an expansion frequency of the system model;
   factorizing the plurality of system matrices at the expansion frequency by a matrix decomposition, wherein each of the plurality of system matrices is decomposed into a plurality of submatrices including an identity matrix;
   constructing a decomposition matrix ($L^{(i)}$) from the plurality of submatrices;
   constructing a sparse implicit projection matrix ($M^{(i)}$) from the decomposition matrix;
   constructing a plurality of reduced order system matrices from the sparse implicit projection matrix without explicitly calculating a projection matrix (M) directly from the plurality of system matrices;
   constructing a reduced order system model of the circuit design having a second system order with the plurality of reduced order system matrices, wherein the second system order is lower than the first system order; and running simulation of the circuit design using the reduced order system model.

12. The non-transitory computer-readable storage medium of claim 11, wherein the plurality of system matrices comprise a conductance matrix, a capacitance matrix and a mapping matrix.

13. The non-transitory computer-readable storage medium of claim 11, wherein the matrix decomposition is a Cholesky decomposition or an LU decomposition.

14. The non-transitory computer-readable storage medium of claim 11, wherein the plurality of system nodes comprises a plurality of internal nodes and a plurality of port nodes.

15. The non-transitory computer-readable storage medium of claim 14 further comprises:
constructing a sparse implicit projection matrix by the matrix decomposition for each of the plurality of internal nodes;
eliminating an internal node of the plurality of internal nodes in each step of constructing a sparse implicit projection matrix; and
repeating the step of eliminating an internal node for the plurality of internal nodes.

16. The non-transitory computer-readable storage medium of claim 14 further comprises:
grouping the plurality of internal nodes in a first group and grouping the plurality of port nodes in a second group; and
reordering the plurality of system nodes by the first and second group.

17. The non-transitory computer-readable storage medium of claim 11, wherein the expansion frequency is selected from a set of expansion frequencies.

18. The non-transitory computer-readable storage medium of claim 17, wherein the factorizing the plurality of system matrices is repeated over the set of expansion frequencies.

19. The non-transitory computer-readable storage medium of claim 15, wherein the second system order is reduced from the first system order by the number of internal nodes after the plurality of internal nodes are eliminated.

20. The non-transitory computer-readable storage medium of claim 11, wherein the plurality of submatrices are recursively constructed and the reduced order system model is constructed from the plurality of submatrices.

* * * * *